United States Patent
Osawa

(10) Patent No.: US 8,169,123 B2
(45) Date of Patent: May 1, 2012

(54) MULTILAYERED PIEZOELECTRIC ELEMENT AND METHOD OF MANUFACTURING THE SAME

(75) Inventor: Atsushi Osawa, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 25 days.

(21) Appl. No.: 12/410,701

(22) Filed: Mar. 25, 2009

(65) Prior Publication Data

US 2009/0243442 A1  Oct. 1, 2009

(30) Foreign Application Priority Data

Mar. 28, 2008 (JP) ................................. 2008-086390

(51) Int. Cl.
 *H01L 41/08* (2006.01)
(52) U.S. Cl. ........................................ 310/328; 310/366
(58) Field of Classification Search .................. 310/328, 310/366
See application file for complete search history.

(56) References Cited

U.S. PATENT DOCUMENTS

| | | | | | |
|---|---|---|---|---|---|
| 5,237,239 | A | * | 8/1993 | Inoue et al. | 310/328 |
| 5,459,371 | A | * | 10/1995 | Okawa et al. | 310/363 |
| 5,523,645 | A | * | 6/1996 | Inoi | 310/364 |
| 5,703,425 | A | * | 12/1997 | Feral et al. | 310/366 |
| 6,597,086 | B1 | * | 7/2003 | Boecking | 310/366 |
| 6,608,428 | B2 | * | 8/2003 | Nishimura et al. | 310/366 |
| 6,700,306 | B2 | * | 3/2004 | Nakamura et al. | 310/328 |
| 7,345,403 | B2 | * | 3/2008 | Iwase et al. | 310/328 |

FOREIGN PATENT DOCUMENTS

| JP | 2004-79825 A | 3/2004 |
|---|---|---|
| JP | 2004-111718 A | 4/2004 |

* cited by examiner

*Primary Examiner* — Mark Budd
(74) *Attorney, Agent, or Firm* — Sughrue Mion, PLLC

(57) ABSTRACT

In a multilayered piezoelectric element, a side insulating film is accurately formed even on a thin multilayered structure. The element includes: a multilayered structure having a step formed on a side surface of the multilayered structure such that an end of an internal electrode is located on a projecting portion of either side surface; a side insulating film for covering the end of the internal electrode on the projecting portion of the side surface; a first flat electrode formed on one principal surface of the multilayered structure; a second flat electrode formed on the other principal surface of the multilayered structure; a first side electrode formed on a first side surface of the multilayered structure and connected to a first group of electrodes; and a second side electrode formed on a second side surface of the multilayered structure and connected to a second group of electrodes.

8 Claims, 9 Drawing Sheets

DISPENSING NOZZLE

~30 μm

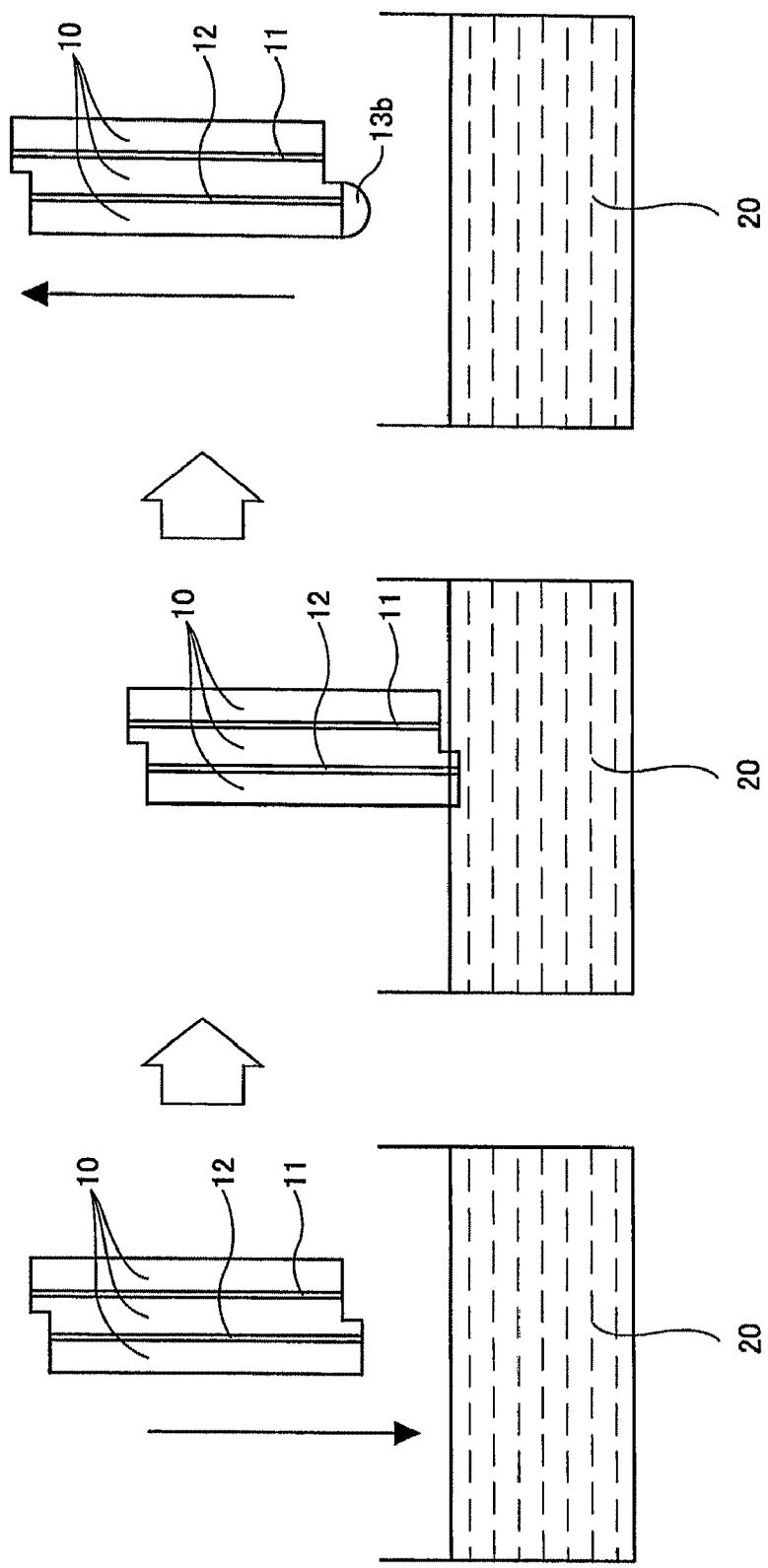

MULTILAYERED PIEZOELECTRIC ELEMENT AND METHOD OF MANUFACTURING THE SAME

BACKGROUND OF THE INVENTION

1. Field of the Invention

The present invention relates to a piezoelectric element having a multilayered structure (multilayered piezoelectric element) to be used as ultrasonic transducers, piezoelectric actuators, and so on, and relates to a method of manufacturing the multilayered piezoelectric element.

2. Description of a Related Art

A piezoelectric material represented by a material having a lead-based perovskite structure such as PZT (Pb(lead) zirconate titanate) provides a piezoelectric effect that it expands and contracts when a voltage is applied thereto. A piezoelectric element having such a property is utilized in various uses such as ultrasonic transducers, piezoelectric actuators, and piezoelectric pumps.

The structure of a piezoelectric element is basically a single-layer structure in which electrodes are formed on both ends of one piezoelectric material. However, according to microfabrication and integration of piezoelectric elements with recent developments of MEMS (micro electro mechanical systems) related devices, multilayered piezoelectric elements each having plural piezoelectric materials and plural electrodes alternately stacked have been used. In such a piezoelectric element, the capacitance of the multilayered structure as a whole can be made larger by connecting electrodes for applying electric fields to the respective plural piezoelectric material layers in parallel. Accordingly, the rise in electrical impedance can be suppressed even when the size of the piezoelectric element is made smaller.

FIGS. 7A and 7B are sectional views for explanation of a method of manufacturing a conventional multilayered piezoelectric element. As shown in FIG. 7A, three piezoelectric material layers 10 and two layers of internal electrodes 21 and 22 are alternately stacked to form a multilayered structure. Further, side insulating films 23 are formed in predetermined positions on the side surfaces of the multilayered structure. Then, side electrodes 24 and 25 and an upper electrode 26 and a lower electrode 27 are formed by applying coating of an electrode material around the multilayered structure.

Then, using a dicing saw, parts "G" and "H" as shown in FIG. 7B are removed, and the side electrode 24 is separated from the lower electrode 26 and the side electrode 25 is separated from the upper electrode 27. Thereby, electric fields can be respectively applied to the three piezoelectric material layers 10 while the short-circuit between the lower electrode 26 and the upper electrode 27 is eliminated.

In this regard, as the frequency of ultrasonic waves transmitted and received by an ultrasonic probe is higher, it becomes necessary to make the thickness of the piezoelectric element smaller. Accordingly, it becomes necessary to make the widths of the side insulating films formed on the side surfaces of the multilayered structure smaller. As a method of forming the insulating films on the side surfaces of the multilayered structure, emulsion electrodeposition, photolithography, printing, and dispensing are used, but it becomes a problem whether or not those methods can deal with the need of making the width of the insulating films smaller.

In resin emulsion electrodeposition, generally, the diameter of emulsion particles is as large as about 50 μm or more, and there is a limit to the width of the insulating films, which can be made around 100 μm as the smallest. Glass emulsion electrodeposition is also proposed, however, if glass as a hard material is used as the insulating films, the electromechanical coupling factor "k" of the piezoelectric material becomes lower. For example, a comparison is made between electromechanical coupling factors k33 in the "33" vibration mode as a vibration mode in which, to a piezoelectric material poled in the third direction (Z-axis direction), an electric field is applied in the same third direction. When k33 of the piezoelectric material is 0.74, if a resin is used as the insulating films, k33 becomes about 0.68 or more, however, if glass is used as the insulating films, k33 becomes as low as about 0.60 to 0.62.

According to photolithography of exposing a resist film to light for patterning, a fine pattern on the order of submicron can be formed, however, it is difficult to form a thick resist film for the insulating films, and, if a thick resist film can be formed, the pattern may be rough. Further, in photolithography, there are problems that times taken for the respective steps are long, and the piezoelectric material is largely damaged because the piezoelectric elements are immersed in an alkaline solution and the resist material is baked at a high temperature in the developing step.

When screen printing is used, the precision of the plate is insufficient and screen alignment is difficult. Further, in formation of the insulating films by dispensing, principally, the lower limit of the width of the insulating films is determined by the size of the dispensing nozzle. In combination of the inner diameter of a dispensing nozzle that is currently and commercially available and the viscosity of an insulating material that can be applied, the limit to the width of the insulating films is about 90 μm to 100 μm. It is conceivable to use an insulating material having high viscosity, but that insulating material cannot be supplied stably from a dispensing nozzle having a small inner diameter.

As a related technology, Japanese Patent Application Publication JP-P2004-79825A discloses a method of manufacturing a multilayered piezoelectric ceramic element by which insulating layers can be formed at a low temperature of 500° C. or less. The manufacturing method is a method of manufacturing a multilayered piezoelectric ceramic element having an external electrode on an insulator insulating every other internal electrode, which is exposed on side surfaces of a multilayered structure having stacked three or more layers of piezoelectric ceramic and two or more layers of internal electrodes, so as to form respective one of opposite electrodes, and includes the step of forming the insulator by applying an insulating material processed to a paste state by using a dispenser.

Further, Japanese Patent Application Publication JP-P2004-111718A discloses a method of manufacturing a multilayered piezoelectric actuator that can sufficiently secure connection between internal electrodes and an external electrode and suppress insulation degradation and breakage due to the discharge phenomenon between the internal electrodes and another external electrode. The manufacturing method is a method of manufacturing a multilayered piezoelectric actuator of forming a multilayered structure by alternately stacking plural piezoelectric materials and plural internal electrodes and connecting every other internal electrode exposed on surfaces of the multilayered structure to the external electrode, and includes the step of forming a notch groove on every other exposed internal electrode, then forming an insulating layer on the side surface on which the internal electrodes are exposed so as to expose only ends of the internal electrodes having the same polarity as that of the external electrode on the surface, and forming the external electrode on the side surface.

However, higher frequencies are desired in ultrasonic probes, and an ultrasonic probe for transmitting and receiving ultrasonic waves at the center frequency of 10 MHz to 15 MHz is necessary to be created. For the purpose, the thickness of a piezoelectric element is 120 µm to 150 µm, and, in the case of a multilayered piezoelectric element having a two-layer or three-layer structure, the thickness of one layer is 40 µm to 75 µm. Accordingly, it is becoming difficult to form insulating films by dispensing. Further, it is also becoming difficult to form a groove in each exposed internal electrode as disclosed in JP-P2004-111718A.

SUMMARY OF THE INVENTION

The present invention has been achieved in view of the above-mentioned problems. A purpose of the present invention is, in a multilayered piezoelectric element to be used as ultrasonic transducers, piezoelectric actuators, and so on, to accurately form a side insulating film even on a thin multilayered structure.

In order to accomplish the above-mentioned purpose, a multilayered piezoelectric element according to one aspect of the present invention includes: a multilayered structure in which plural piezoelectric material layers and at least one internal electrode are alternately stacked, a step formed on at least one side surface of the multilayered structure such that an end of the at least one internal electrode is located on a projecting portion of either side surface; at least one side insulating film for covering the end of the at least one internal electrode on the projecting portion of the at least one side surface of the multilayered structure; a first flat electrode formed on one principal surface of the multilayered structure; a second flat electrode formed on the other principal surface of the multilayered structure; a first side electrode formed on a first side surface of the multilayered structure and connected to a first group of electrodes as odd-numbered electrodes of the first and second flat electrodes and the at least one internal electrode; and a second side electrode formed on a second side surface of the multilayered structure and connected to a second group of electrodes, which do not belong to the first group of electrodes, of the first and second flat electrodes and the at least one internal electrode.

Further, a method of manufacturing a multilayered piezoelectric element according to one aspect of the present invention includes the steps of: (a) fabricating a multilayered structure in which plural piezoelectric material layers and at least one internal electrode are alternately stacked; (b) forming a step on at least one side surface of the multilayered structure such that an end of the at least one internal electrode is located on a projecting portion of either side surface; (c) forming at least one side insulating film for covering the end of the at least one internal electrode on the projecting portion of the at least one side surface of the multilayered structure; (d) forming a first flat electrode on one principal surface of the multilayered structure, forming a second flat electrode on the other principal surface of the multilayered structure, forming a first side electrode on a first side surface of the multilayered structure and connected to a first group of electrodes as odd-numbered electrodes of the first and second flat electrodes and the at least one internal electrode, and forming a second side electrode on a second side surface of the multilayered structure and connected to a second group of electrodes, which do not belong to the first group of electrodes, of the first and second flat electrodes and the at least one internal electrode.

According to the present invention, since a step is formed on at least one side surface of the multilayered structure and a side insulating film is formed for covering an end of an internal electrode on a projecting portion of the at least one side surface, the side insulating film can be accurately formed even on a thin multilayered structure.

BRIEF DESCRIPTION OF THE DRAWINGS

FIG. 5 is a diagram for explanation of a method of manufacturing a multilayered piezoelectric element according to the fourth embodiment of the present invention;

DESCRIPTION OF THE PREFERRED EMBODIMENTS

Figure 1:
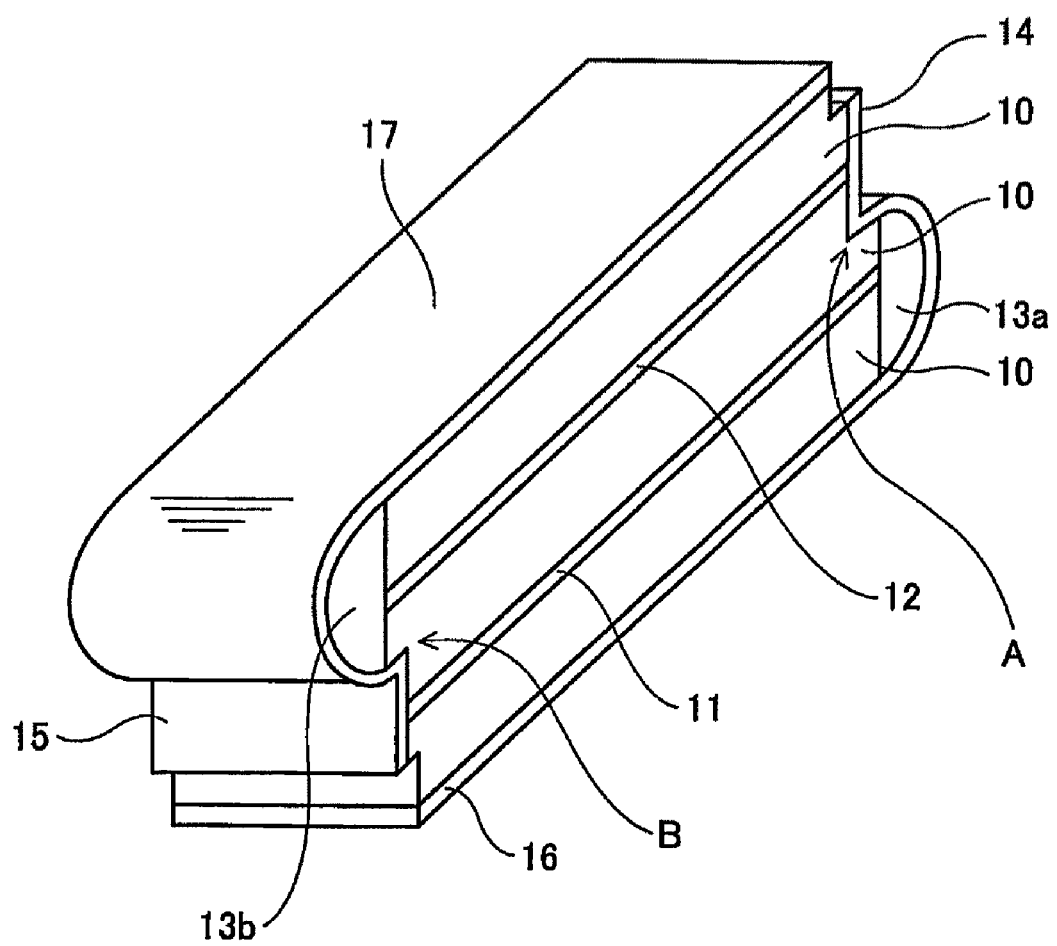
FIG. 1 is a perspective view showing a multilayered piezoelectric element according to the first embodiment of the present invention.

Hereinafter, preferred embodiments of the present invention will be explained in detail by referring to the drawings. The same reference numerals are assigned to the same component elements and the explanation thereof will be omitted.

FIG. 1 is a perspective view showing a multilayered piezoelectric element according to the first embodiment of the present invention. The multilayered piezoelectric element has a multilayered structure in which three piezoelectric material layers 10 and a first internal electrode 11 and a second internal electrode 12 are alternately stacked, a side insulating film 13a formed on one side surface of the multilayered structure (on the right in the drawing), a side insulating film 13b formed on the other side surface of the multilayered structure (on the left in the drawing), side electrodes 14 and 15, a lower electrode 16, and an upper electrode 17. Although three piezoelectric material layers 10 are shown in FIG. 1, the number of piezoelectric material layers may be four or more. When the number of piezoelectric material layers is five or more, the multilayered structure includes plural first internal electrodes 11 and plural second internal electrodes 12.

As shown in FIG. 1, since steps "A" and "B" are formed on both side surfaces of the multilayered structure, the right end of the internal electrode 11 is located on the projecting portion of the right side surface, and the left end of the internal electrode 12 is located on the projecting portion of the left side surface. Thereby, as will be explained later, the side insulating films 13a and 13b are easily formed. The side insulating film 13a covers the right end of the internal electrode 11 in the projecting portion of the right side surface of the multilayered structure, and the side insulating film 13b covers the left end of the internal electrode 12 in the projecting portion of the left side surface of the multilayered structure. Since each of the side insulating films 13a and 13b has a shape including a part of a cylinder or a curved surface, the side electrodes 14 and 15 are easily formed but hardly cut.

Here, the side electrodes 14 and 15 and the lower electrode 16 and the upper electrode 17 may simultaneously or separately be formed. In either case, the side electrode 14 is connected to the lower electrode 16 and the second internal electrode 12 as odd-numbered electrodes (the first group of electrodes) and insulated from the first internal electrode 11 and the upper electrode 17 as even-numbered electrodes (the second group of electrodes that do not belong to the first group of electrodes). Further, the side electrode 15 is connected to the first internal electrode 11 and the upper electrode 17 as the even-numbered electrodes (the second group of electrodes that do not belong to the first group of electrodes) and insulated from the lower electrode 16 and the second internal electrode 12 as the odd-numbered electrodes (the first group of electrodes). When a voltage is applied between the lower electrode 16 and the upper electrode 17, electric fields are applied to the three piezoelectric material layers 10, respectively, and the multilayered piezoelectric element expands and contracts as a whole due to the piezoelectric effect in the respective piezoelectric material layers 10.

The piezoelectric material layer 10 has a thickness of about 40 μm to 50 μm, for example, and a long side of its bottom surface of about 3 mm to 4 mm, for example. The piezoelectric material layer 10 is formed by using a piezoelectric material such as PZT (Pb(lead) zirconate titanate).

Each of the first and second internal electrodes 11 and 12 has a thickness of about 1 μm to 3 μm, for example and may be formed of one kind of material or may have a multilayer structure formed of plural different materials. In the former example, a metal material such as platinum (Pt) or silver palladium (Ag—Pd) is used. Further, in the latter example, a two-layer structure including an adhesion layer formed in a thickness of about 50 nm by using titanium oxide ($TiO_2$) and a conducting layer formed in a thickness of about 3 μm by using platinum (Pt) is used.

The side insulating films 13a and 13b are formed of a highly insulating resin such as an epoxy, silicone, urethane acrylate, or oxetane resin, for example. In such a resin, the Young's modulus is $1.3 \times 10^9$ Pa to $2.0 \times 10^9$ Pa, which is much smaller than that of glass or the like. Accordingly, when the piezoelectric material layers 10 are expanding or contracting, the side insulating films 13a and 13b can follow the expansion and contraction (deformation) of the piezoelectric material layers 10, and thus, there is little braking of the deformation of the piezoelectric material layers 10 due to side insulating films 13a and 13b.

As the side electrodes 14 and 15 and the lower electrode 16 and the upper electrode 17, electrodes of one kind of material selected from gold (Au), platinum (Pt), titanium (Ti), and so on, for example, two-layer structure electrodes of chromium (Cr) and gold (Au), or three-layer structure electrodes of nickel (Ni), titanium (Ti), and platinum (Pt) are used.

Next, a multilayered piezoelectric element according to the second embodiment of the present invention will be explained. In the second embodiment, the case where two piezoelectric material layers are formed will be explained. The rest of the configuration is the same as that of the first embodiment.

Figure 2:
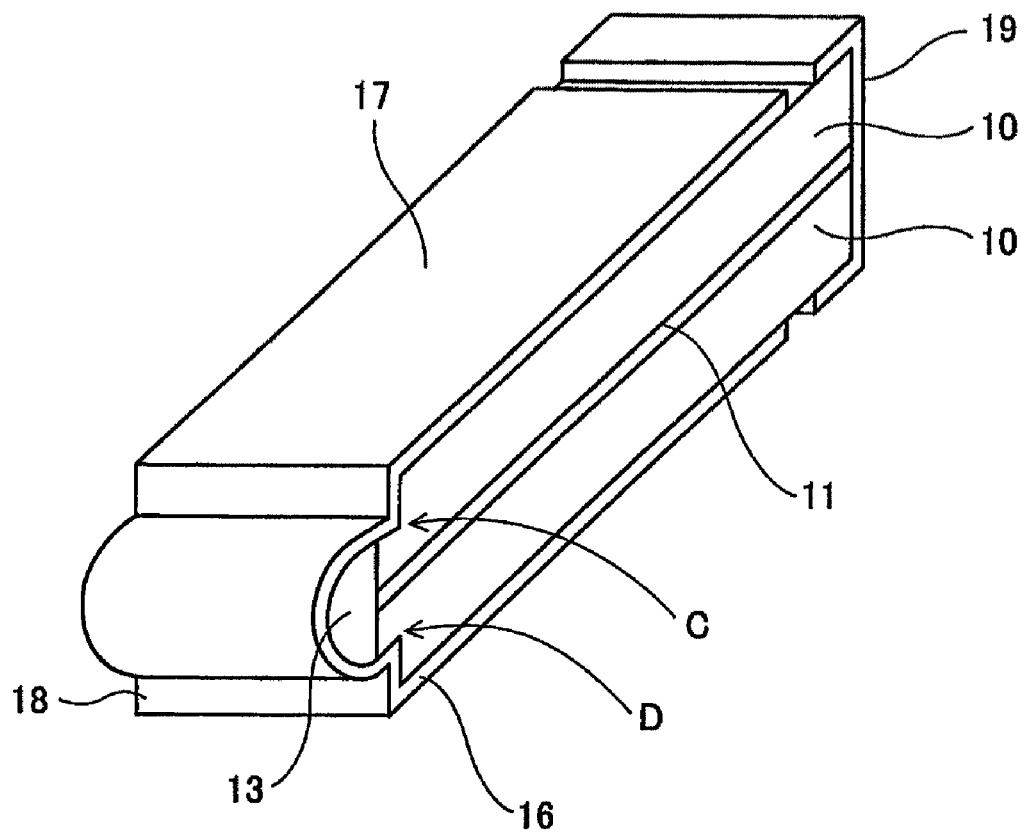
FIG. 2 is a perspective view showing the multilayered piezoelectric element according to the second embodiment of the present invention.

FIG. 2 is a perspective view showing the multilayered piezoelectric element according to the second embodiment of the present invention. The multilayered piezoelectric element has a multilayered structure in which two piezoelectric material layers 10 and an internal electrode 11 are alternately stacked, a side insulating film 13 formed on one side surface of the multilayered structure (on the left in the drawing), side electrodes 18 and 19, a lower electrode 16, and an upper electrode 17.

As shown in FIG. 2, since steps "C" and "D" are formed on one side surface of the multilayered structure (on the left in the drawing), the left end of the internal electrode 11 is located on the projecting portion of the left side surface. Thereby, as will be explained later, the side insulating film 13 is easily formed. The side insulating film 13 covers the left end of the internal electrode 11 in the projecting portion of the left side surface of the multilayered structure. Since the side insulating film 13 has a shape including a part of a cylinder or a curved surface, the side electrodes 18 and 19 are easily formed but hardly cut.

Here, the side electrode 18 and the lower electrode 16 and the upper electrode 17 may simultaneously or separately be formed. In either case, the side electrode 18 is connected to the lower electrode 16 and the upper electrode 17 as odd-numbered electrodes (the first group of electrodes) and insulated from the internal electrode 11 as an even-numbered electrode (the second group of electrodes that do not belong to the first group of electrodes). Further, the side electrode 19 is connected to the internal electrode 11 as the even-numbered electrode (the second group of electrodes that do not belong to the first group of electrodes) and insulated from the lower electrode 16 and the upper electrode 17 as the odd-numbered electrodes (the first group of electrodes). When a voltage is applied between the lower electrode 16 and the side electrode 19, electric fields are applied to the two piezoelectric material layers 10, respectively, and the multilayered piezoelectric element expands and contracts as a whole due to the piezoelectric effect in the respective piezoelectric material layers 10.

Next, a method of manufacturing a multilayered piezoelectric element according to the third embodiment of the present invention will be explained.

FIGS. 3A-3G are diagrams for explanation of the method of manufacturing a multilayered piezoelectric element according to the third embodiment of the present invention. Here, the case where a multilayered piezoelectric element having three piezoelectric material layers as in the first embodiment is manufactured will be explained.

Figure 3A:
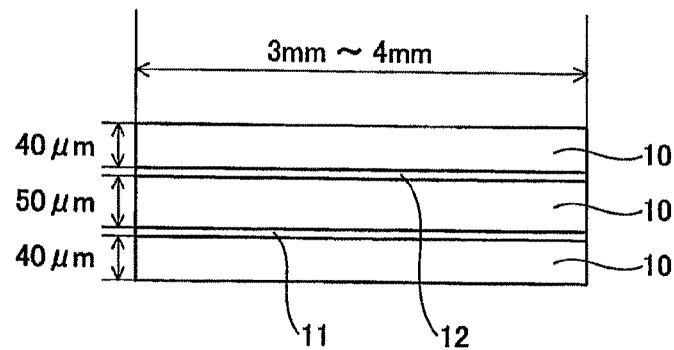
FIGS. 3A-3G are diagrams for explanation of a method of manufacturing a multilayered piezoelectric element according to the third embodiment of the present invention.

First, as shown in FIG. 3A, a multilayered structure is fabricated by stacking three piezoelectric material layers 10 and a first internal electrode 11 and a second internal electrode 12. The first internal electrode 11 and the second internal electrode 12 are alternately stacked with the piezoelectric material layer 10 in between. The thicknesses of the lower, middle, upper piezoelectric material layers are about 40 μm, 50 μm, 40 μm, respectively, for example, and the long sides of the bottom surfaces are about 3 mm to 4 mm, for example.

The multilayered structure may be fabricated using the green sheet method, for example, by stacking piezoelectric bulk materials having internal electrode formed therein, or using the aerosol deposition (AD) method of depositing a powdery material by spraying the material toward the lower layer at a high speed. The AD method is a film forming method that has recently attracted attention as a method of forming a ceramic film.

Figure 3B:
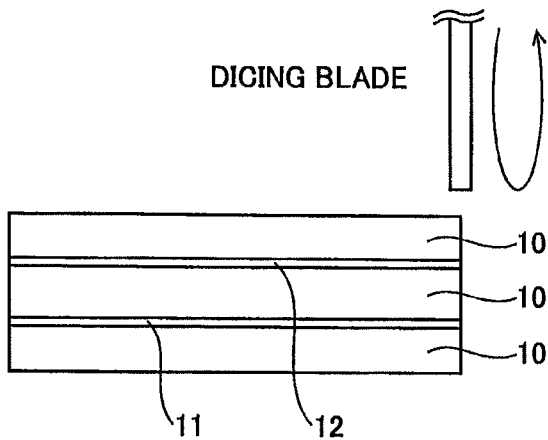
Figure 3C:
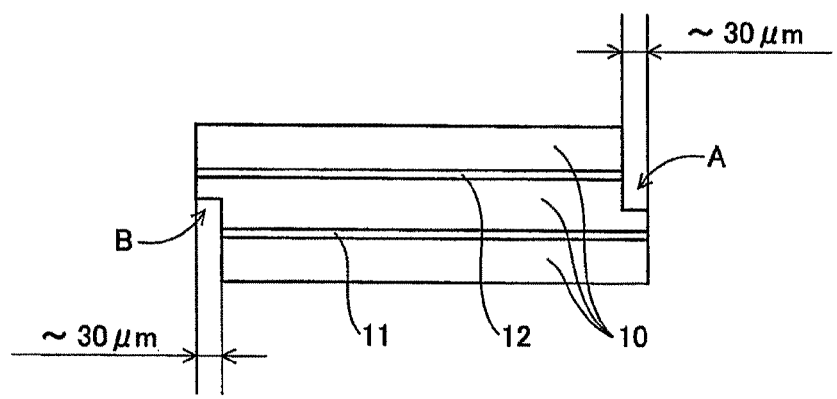

Then, as shown in FIGS. 3B and 3C, steps "A" and "B" are formed by forming notches (cut parts) that reach the internal electrode 12 or 11 in parts of the respective side surfaces of the multilayered structure. The widths of the notches "A" and "B" are about 30 μm or less, for example. Thereby, projecting portions are provided on both side surfaces of the multilayered structure.

Figure 3D:
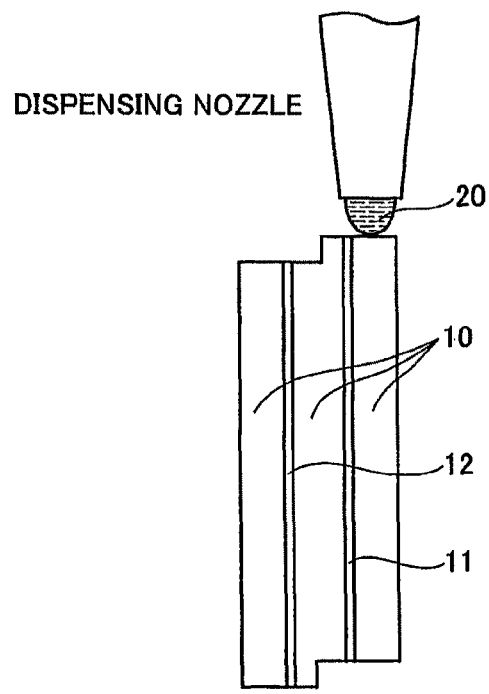

Then, as shown in FIG. 3D, using a dispenser, a liquid-state resin 20 is applied to the projecting portions of the side surfaces of the multilayered structure. As the resin 20, for example, a light curing (including ultraviolet curing) synthetic resin or thermosetting synthetic resin may be used. The liquid-state resin 20 ejected from the dispensing nozzle of the dispenser distributes along the projecting portions of the side surfaces of the multilayered structure because of the edge effect that the surface tension increases at the step parts formed on the side surfaces of the multilayered structure. Accordingly, the dispensing operation becomes very easy. Typically, when there is no step, it is necessary to make the trajectory of the dispensing nozzle substantially in parallel with the principal surface of the multilayered structure for forming side insulating films having homogeneous thicknesses. On the other hand, according to the embodiment, the edges of the step parts finally determine the widths of the side insulating films, and therefore, the adjustment of height and parallelism of the dispensing nozzle becomes easier than in the conventional case.

Figure 3E:
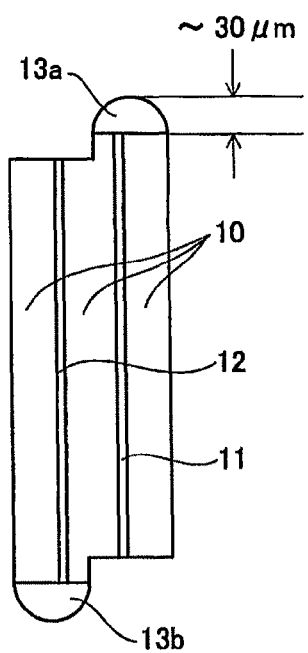

Then, the liquid-state resin 20 is cured by applying light or heat to the resin, and thereby, as shown in FIG. 3E, the side insulating films 13a and 13b are formed. The side insulating film 13a covers the end of the internal electrode 11 on one side surface and the side insulating film 13b covers the end of the internal electrode 12 on the other side surface.

Figure 3F:
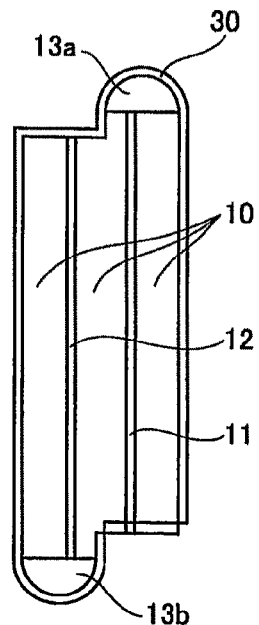

Then, as shown in FIG. 3F, using a physical evaporation method such as sputtering, for example, the first and second principal surfaces and the first and second side surfaces of the multilayered structure are coated with an electrode material (conducting material) 30. Here, formation of the electrode material 30 may successively or separately be performed on the two principal surfaces and the side surfaces. Further, formation of the electrode material on the front surface and the back surface of the multilayered structure is avoided.

Figure 3G:
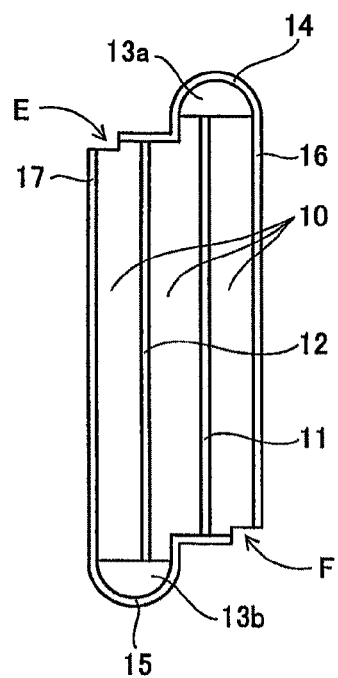

Then, as shown in FIG. 3G, notches "E" and "F" that reach the piezoelectric material layers 10 are provided in parts of the multilayered structure on which the electrode material has been formed. As a result, the rest of the electrode material forms the electrodes (the side electrode 15 and the upper electrode 17) connected to the first internal electrode 11 and insulated from the second internal electrode 12, and the electrodes (the side electrode 14 and the lower electrode 16) connected to the second internal electrode 12 and insulated from the first internal electrode 11.

Figure 4:
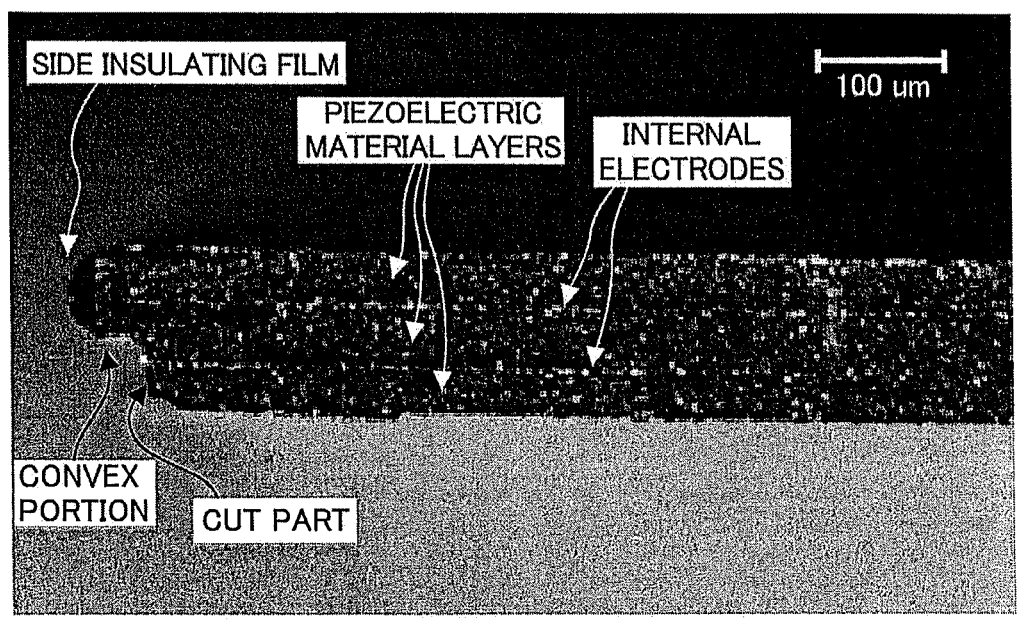
FIG. 4 is a photograph showing a section of a multilayered piezoelectric element manufactured by the method of manufacturing a multilayered piezoelectric element according to the third embodiment of the present invention.

FIG. 4 is a photograph showing a section of a multilayered piezoelectric element manufactured by the method of manufacturing a multilayered piezoelectric element according to the third embodiment of the present invention. In FIG. 4, the multilayered piezoelectric element in the status shown in FIG. 3E is shown. As shown in FIG. 4, the multilayered structure is formed by stacking the three piezoelectric material layers with two internal electrodes in between. The projecting portion is provided by forming a notch (cut part) on the side surface of the multilayered structure, and the side insulating film is formed on the projecting portion. The section of the side insulating film has a substantially circular shape.

Next, a method of manufacturing a multilayered piezoelectric element according to the fourth embodiment of the present invention will be explained. In the method of manufacturing a multilayered piezoelectric element according to the fourth embodiment, only the step of forming the side insulating film differs from that of the third embodiment (FIG. 3D), and the rest of the method is the same as that of the third embodiment.

FIG. 5 is a diagram for explanation of the method of manufacturing a multilayered piezoelectric element according to the fourth embodiment of the present invention. In the fourth embodiment, using the dip method of immersing the side surface of the multilayered structure on which the projecting portion has been provided, the liquid-state resin 20 is attached to the projecting portion on the side surface of the multilayered structure. Then, the multilayered structure is drawn up from the liquid-state resin 20 and the resin is cured, and thereby, the side insulating film 13b is formed.

According to the above-mentioned embodiments, the side insulating film can be accurately formed even on a thin multilayered structure. On this account, the range of application of the multilayered piezoelectric element becomes wider. For example, stacking of piezoelectric material layers in an ultrasonic probe for high frequency (10 MHz or higher), which has conventionally been difficult, can be realized. Further, using the increase in surface tension on the step parts, the side insulating films narrower but thicker than the conventional ones can be formed, and breakdown hardly occurs. Therefore, high-voltage driving can be performed in ultrasonic transducers, piezoelectric actuators, and so on, and the larger amplitude (amount of deformation) can be taken. Furthermore, in the multilayered structure, even when the internal electrode is not in parallel with the principal surfaces of the piezoelectric material layers, but undulated, protrusion of the side insulating film can be prevented.

Figure 6A:
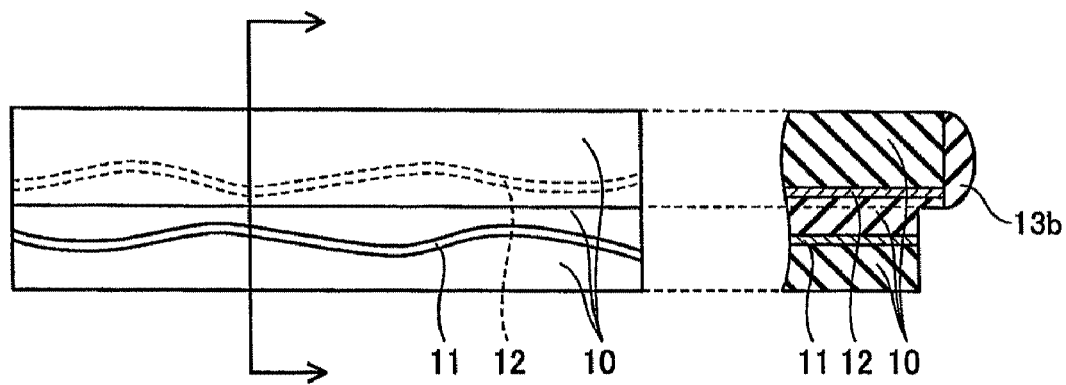
FIGS. 6A and 6B are comparative diagrams of the multilayered structure and the side insulating film between the present invention and a conventional example.
Figure 6B:
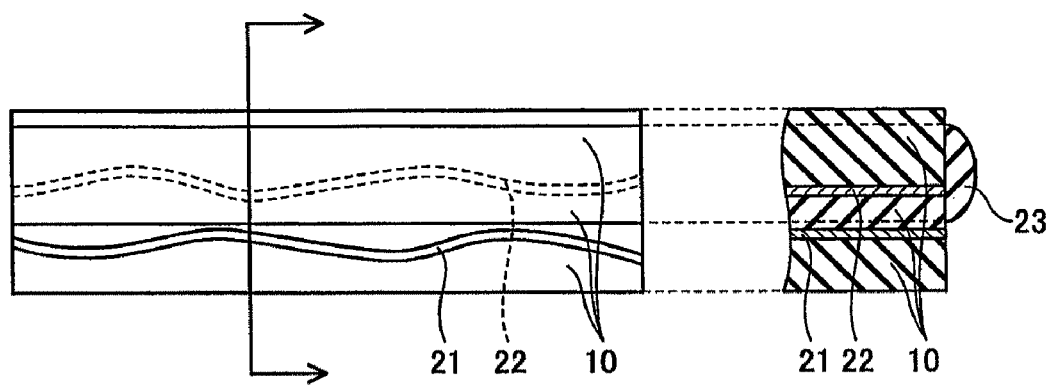
Figure 7A:
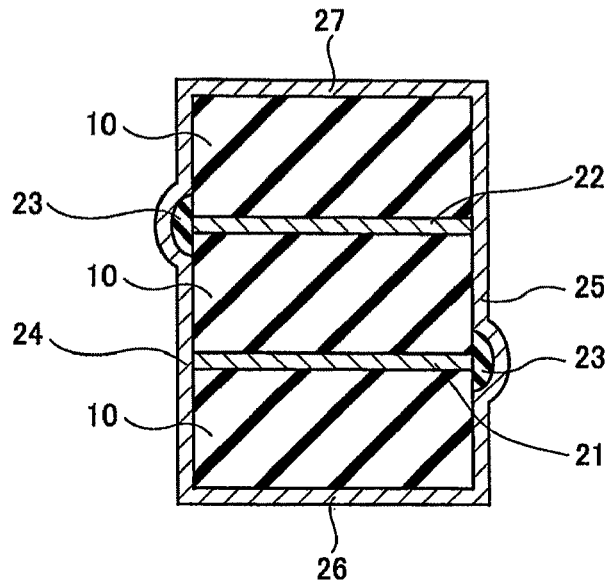
FIGS. 7A and 7B are sectional views for explanation of a method of manufacturing a conventional multilayered piezoelectric element.
Figure 7B:
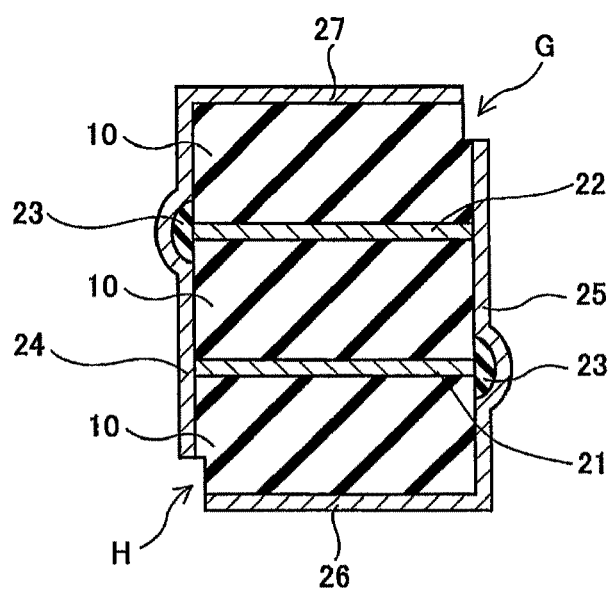

FIGS. 6A and 6B are comparative diagrams of the multilayered structure and the side insulating film between the present invention and a conventional example. FIG. 6A is a side view and sectional view of the multilayered structure and the side insulating film in the present invention, in which the step is formed on the multilayered structure and the side insulating film 13b is formed only on the projecting portion of the multilayered structure. Therefore, even when the internal electrodes 11 and 12 are not in parallel with the principal surfaces of the piezoelectric material layers 10 but undulated, the side insulating film 13b reliably covers the end of the internal electrode 12 and spacing between the side insulating film 13b and the end of the internal electrode 11 is secured. The precision of the respective parts can be sufficiently secured according to the precision (2 μm to 5 μm) of a processing machine such as a dicing saw.

FIG. 6B is a side view and sectional view of the multilayered structure and the side insulating film in the conventional example. When a side insulating film 23 is provided to reliably cover the end of the internal electrode 22, spacing between the side insulating film 23 and the end of an internal electrode 21 is not sufficiently secured, and the side insulating film 23 may cover the end of the internal electrode 21.

The invention claimed is:

1. A multilayered piezoelectric element comprising:
a multilayered structure in which plural piezoelectric material layers and at least one internal electrode are alternately stacked, at least one step formed on at least one side surface of said multilayered structure such that said multilayered structure has a region projecting from adjacent regions on the at least one side surface, and an end of said at least one internal electrode is located at the projecting region of said multilayered structure on either side surface thereof;
at least one side insulating film for covering the end of said at least one internal electrode at the projecting region of said multilayered structure on the at least one side surface;
a first flat electrode disposed on one principal surface of said multilayered structure;

a second flat electrode disposed on the other principal surface of said multilayered structure;

a first side electrode disposed on a first side surface of said multilayered structure and connected to a first group of electrodes as odd-numbered electrodes of said first and second flat electrodes and said at least one internal electrode; and a second side electrode disposed on a second side surface of said multilayered structure and connected to a second group of electrodes, which do not belong to the first group of electrodes, of said first and second flat electrodes and said at least one internal electrode.

2. The multilayered piezoelectric element according to claim 1, wherein said at least one side insulating film has a shape including one of a part of a cylinder and a curved surface.

3. The multilayered piezoelectric element according to claim 1, wherein said at least one side insulating film includes an insulating resin having a Young's modulus within a range from $1.3 \times 10^9$ Pa to $2.0 \times 10^9$ Pa.

4. The multilayered piezoelectric element according to claim 1, wherein said at least one side insulating film includes one of an epoxy resin, a silicone resin, an urethane acrylate resin, and an oxetane resin.

5. A multilayered piezoelectric element comprising:

a multilayered structure in which plural piezoelectric material layers and plural internal electrodes including a first internal electrode and a second internal electrode are alternately stacked, steps respectively formed on a first side surface and a second side surface of said multilayered structure such that each of said first and second side surfaces are divided into a first region and a second region, the first region projects from the second region, a first end of said first internal electrode is located at the first region of the first side surface and a second end of said first internal electrode is located at the second region of the second side surface, and a first end of said second internal electrode is located at the second region of the first side surface and a second end of said second internal electrode is located at the first region of the second side surface of said multilayered structure;

a first side insulating film for covering the first end of said first internal electrode at the first region of the first side surface of said multilayered structure;

a second side insulating film for covering the second end of said second internal electrode at the first region of the second side surface of said multilayered structure;

a first flat electrode disposed on one principal surface of said multilayered structure;

a second flat electrode disposed on the other principal surface of said multilayered structure;

a first side electrode disposed on the first side surface of said multilayered structure and connected to a first group of electrodes as odd-numbered electrodes of said first and second flat electrodes and said plural internal electrodes; and a second side electrode disposed on the second side surface of said multilayered structure and connected to a second group of electrodes, which do not belong to the first group of electrodes, of said first and second flat electrodes and said plural internal electrodes.

6. The multilayered piezoelectric element according to claim 5, wherein each of said first and second side insulating films has a shape including one of a part of a cylinder and a curved surface.

7. The multilayered piezoelectric element according to claim 5, wherein each of said first and second side insulating films includes an insulating resin having a Young's modulus within a range from $1.3 \times 10^9$ Pa to $2.0 \times 10^9$ Pa.

8. The multilayered piezoelectric element according to claim 5, wherein each of said first and second side insulating films includes one of an epoxy resin, a silicone resin, an urethane acrylate resin, and an oxetane resin.

* * * * *